United States Patent [19]

Saito et al.

[11] Patent Number: 5,261,403
[45] Date of Patent: Nov. 16, 1993

[54] MAGNETIC RESONANCE IMAGING APPARATUS

[75] Inventors: Minoru Saito, Ibaraki; Toshihiro Ishizuka; Yasuo Wada, both of Katsuta, all of Japan

[73] Assignee: Hitachi, Ltd., Tokyo, Japan

[21] Appl. No.: 839,662

[22] Filed: Jan. 21, 1992

Related U.S. Application Data

[63] Continuation of Ser. No. 481,647, Feb. 12, 1990, abandoned, which is a continuation of Ser. No. 175,319, Mar. 30, 1988, abandoned.

[30] Foreign Application Priority Data

Mar. 30, 1987 [JP] Japan .................................. 62-76568

[51] Int. Cl.⁵ .................................................. A61B 5/055
[52] U.S. Cl. .............................. 128/653.2; 128/653.5; 324/318
[58] Field of Search ........................ 128/653.2, 653.5; 324/318, 322

[56] References Cited

U.S. PATENT DOCUMENTS

| | | | |
|---|---|---|---|
| 4,712,067 | 12/1987 | Roschmann et al. | 324/318 |
| 4,734,647 | 3/1988 | Yoshimura | 324/318 |
| 4,740,751 | 4/1988 | Misic et al. | 324/318 |
| 4,831,330 | 5/1989 | Takahashi | 128/653 X |
| 4,841,248 | 6/1989 | Mehdizadeh et al. | 324/318 |

*Primary Examiner*—Ruth S. Smith
*Attorney, Agent, or Firm*—Antonelli, Terry, Stout & Kraus

[57] ABSTRACT

In an MR imaging apparatus, a receiving coil comprising an upper coil and a lower coil which jointly sandwitch a desired part of a body to be inspected in an openable and closable manner, the upper and the lower coils being connected by connection means comprised of flexible and electrically conductive member to form a single coil. NMR signals can be detected at a high sensitivity, enabling an image of a high S/N ratio and measurement of a wide detection region.

7 Claims, 5 Drawing Sheets

MAGNETIC RESONANCE IMAGING APPARATUS

This application is a continuation of application Ser. No. 481,647, filed Feb. 12, 1990, now abandoned, which is a continuation of application Ser. No. 175,319, filed Mar. 30, 1988, now abandoned.

BACKGROUND OF THE INVENTION

This invention relates to a magnetic resonance (MR) imaging apparatus for forming an image of a certain cross-section of a body to be inspected by using nuclear magnetic resonance (NMR), and more particularly to an MR imaging apparatus having an improved receiving coil for receiving nuclear magnetic resonance signals.

The MR imaging apparatus usually uses hydrogen nuclei (protons) in a living organ as the detecting target to be inspected. A living body is placed in a static magnetic field Ho. A pulse-like electromagnetic wave is irradiated externally onto the living body to excite protons in the body. When the pulse is cut off, the excited protons return to the original energy state and, upon this transition, emit the once-absorbed energy to the external as electromagnetic waves. These released electromagnetic waves are the NMR signals. A receiving coil for receiving these NMR signals is placed around the body to be inspected to receive the NMR signals. The received signals are amplified and processed to form an image.

In a conventional MR imaging apparatus as shown in FIG. 8, a body to be inspected or measured (human body) 1 is carried into an accommodation space 19. Then, diagnosis of an abdominal part or a breast part is performed utilizing the nuclear magnetic resonance, and a cross-section 11, e.g. of an abdominal part, of a human body is displayed on a picture plane, as shown in FIG. 7.

The human body 1 is laid down on a slide plate 12 of a bed 17 and is carried into or out of the accommodation space 19 by the horizontal transport operation of the slide plate 12, as shown in FIG. 8. The accommodation space 19 is defined to be surrounded by a plurality of static magnetic field devices (magnets for establishing a static field) 14 and a plurality of gradient magnetic field devices (coils for generating a gradient field) 15, which devices 14 and 15 all have respective ring shapes. An RF irradiation coil 16 serving as a transmitting coil and a receiving coil 10 for the whole body use, both of circular ring shape, one disposed inside the static field magnets 14 and the gradient magnetic field coils 15. The RF irradiation coil 16 is provided to generate a high frequency magnetic field for causing NMR phenomenon. A unit 20 serves for applying signals to the static magnetic field devices 14, gradient magnetic field devices 15 as well as supplying signals to the RF irradiation coil 16 and receiving signals from the receiving coil 10 and for image-processing the NMR signals detected.

The space inside the receiving coil 10 should be large for giving tolerance, as shown in FIG. 7, due to the facts that a body 1 to be inspected should be carried into and out of the accommodation space 19 through one end of the receiving coil 10, and that the receiving coil 10 should allow various sizes of the human body to pass through. As a result of this arrangement, the receiving sensitivity of the receiving coil should be low compared to the receiving coil for inspecting a head part.

The receiving sensitivity of a coil, i.e. the S/N ratio of the NMR signal is proportional to the filling factor $\eta$, $$S/N \propto K\eta \sqrt{Q} , \quad (1)$$

where K is a constant and Q is the quality factor of the coil. The filling factor $\eta$ is a coefficient representing the ratio of the volume occupied by the body to be inspected in the volume of the coil. A larger filling factor represents that the body to be inspected is disposed closer to the coil.

For the conventional receiving coil for the whole body use, the accommodation space is designed large enough as described above and hence the receiving sensitivity should be low compared to the coil for inspecting a head part.

A surface coil method has been proposed recently, which can solve the above problem.

According to the surface coil method, a coil is directly placed on a portion of the specimen to be imaged. Therefore, it is possible to increase the filling factor compared to the conventional receiving coil for the whole body use and even to the conventional receiving coil for the head part. The detectable region, however, is determined by the coil diameter. The detectable region of a surface coil should be narrow and the detection sensitivity in the depth direction cannot be assured. The detectable region is limited to a region of about a radius of the coil diameter.

For general knowledge of the MR imaging apparatus, reference should be made to, for example, JP-A-61-71103(U), JP-A-61-159949, and JP-A-61-59806.

As described above, in the conventional MR imaging apparatus, the receiving coil for the whole body use is disposed inside the magnets and requires an extra space for accommodating a patient with sufficient tolerance. Thus, the filling factor of the coil was low and the detection sensitivity could not be increased. The surface coil can detect a part of a patient with a high sensitivity, but suffers from a narrow detection range.

SUMMARY OF THE INVENTION

An object of this invention is to provide a high S/N image by detecting NMR signals generated from the whole body range of the breast part or the abdominal part of a patient with a high sensitivity.

Another object of this invention is to provide a receiving coil having a wide detection range.

A receiving coil is divided into an upper coil and a lower coil in conformity with the shape of a detection part such as the breast part or the abdominal part of a patient. These upper and lower coils are connected with a flexible and electrically conductive member to constitute a single receiving coil and are openable or closable by an open-close mechanism. This receiving coil is mounted directly on a bed to be transportable. When the upper and the lower coils are in an open state, a patient enters into or gets out of the receiving coil.

As described above, since the receiving coil has such a structure that a patient goes in and out when the upper and the lower coils are open, the upper and the lower coils can be shaped in conformity with the shape of a detection part of the patient. Thus, the distance between the detection region and the receiving coil can be reduced compared to the conventional case. The volume ratio of the body to be inspected to the receiving coil can be made substantially 1 to 1. Compared to the conventional system of inserting a patient with a volume ratio being almost ½ to 1, the filling factor of the coil can be increased to about twice the conventional value. As for the detection sensitivity, a substantially doubled S/N ratio can be provided. Further, since this receiving coil is directly mounted on a bed and is freely transportable, it can be easily handled.

DESCRIPTION OF THE PREFERRED EMBODIMENTS

Now, description will be made on an embodiment of this invention, referring to the accompanying drawings.

Figure 1:
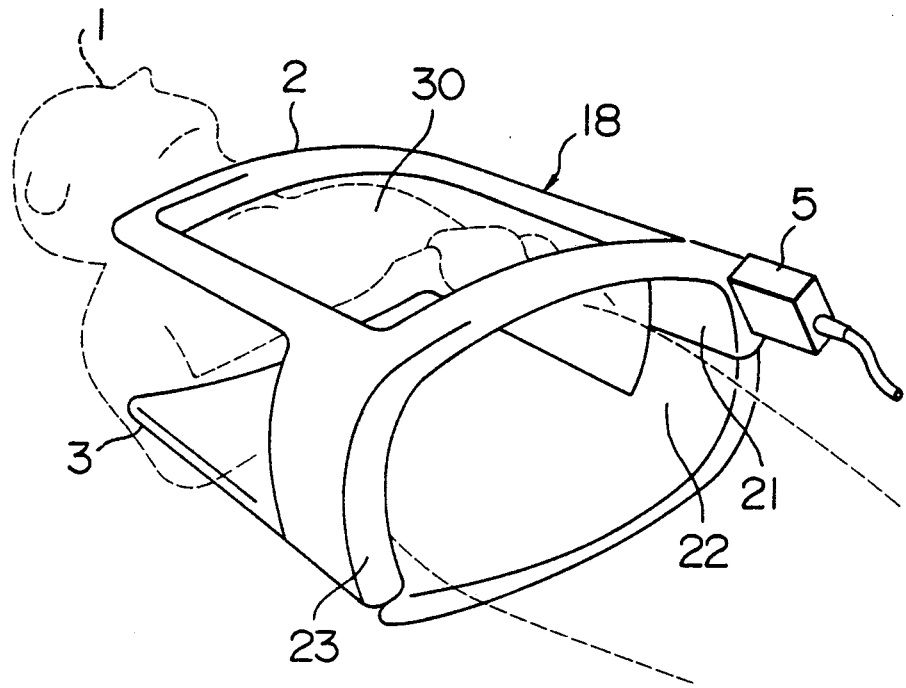
FIG. 1 is a perspective view showing a receiving coil of an MR imaging apparatus according to an embodiment of this invention.
Figure 2:
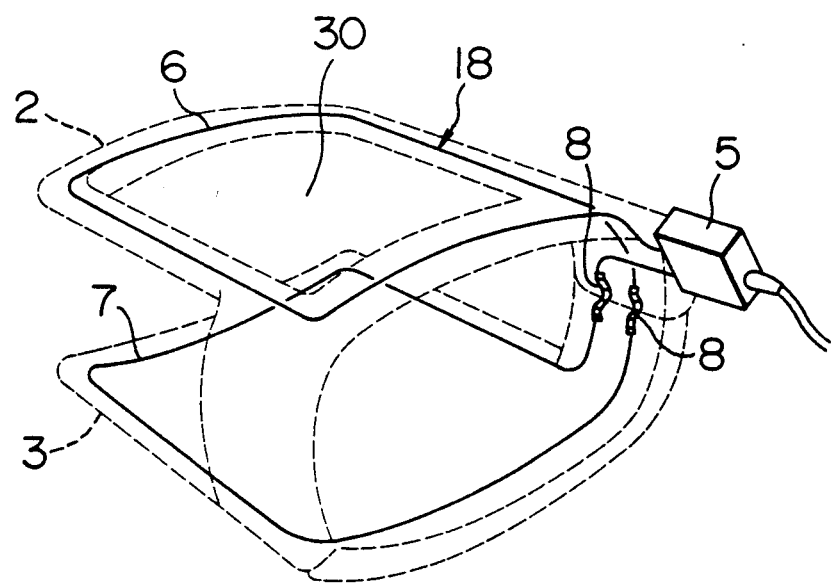
FIG. 2 is a schematic perspective view showing an inner structure of the receiving coil of FIG. 1.
Figure 3A:
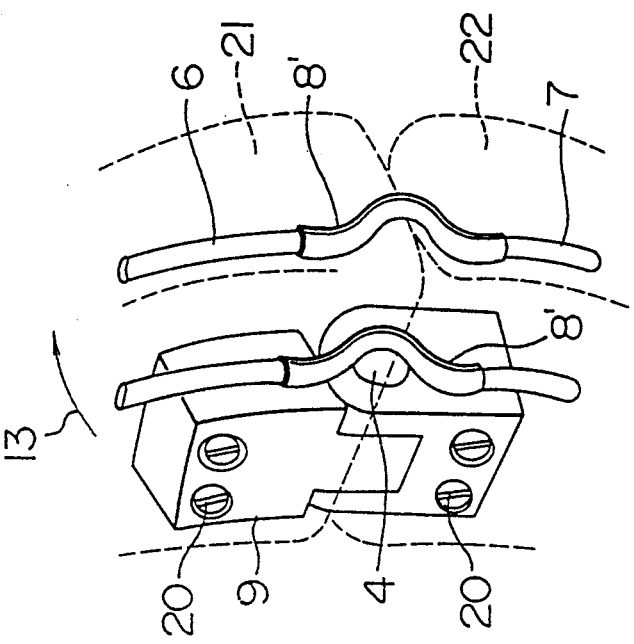
FIG. 3A and 3B are perspective views showing part of an upper coil and a lower coil in the receiving coil of FIG. 1 with difference arrangements of flexible electrically conductive members.
Figure 3B:
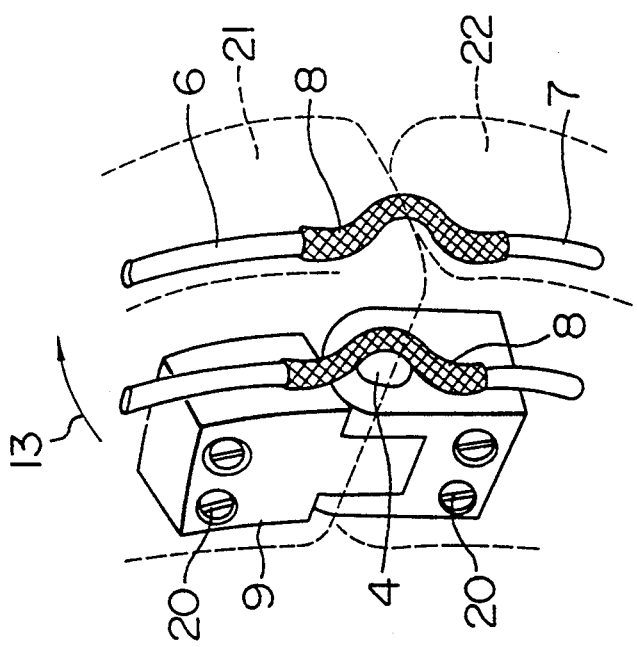
Figure 4:
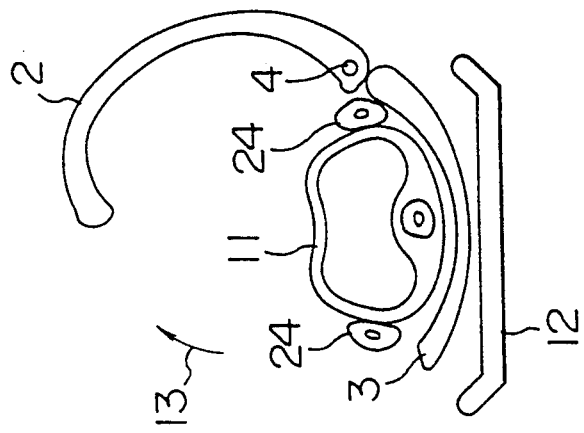
FIG. 4 is a schematic diagram showing the closed state of the receiving coil of FIG. 1.
Figure 5:
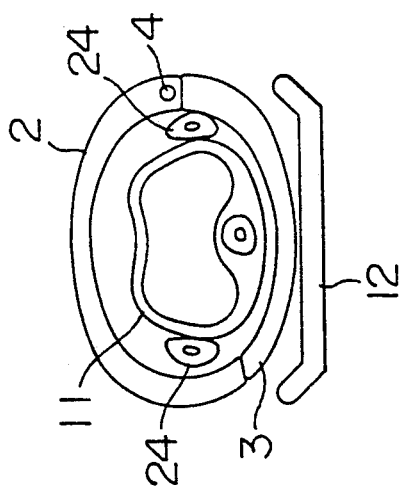
FIG. 5 is a schematic diagram showing the open state of the receiving coil of FIG. 1.
Figure 6:
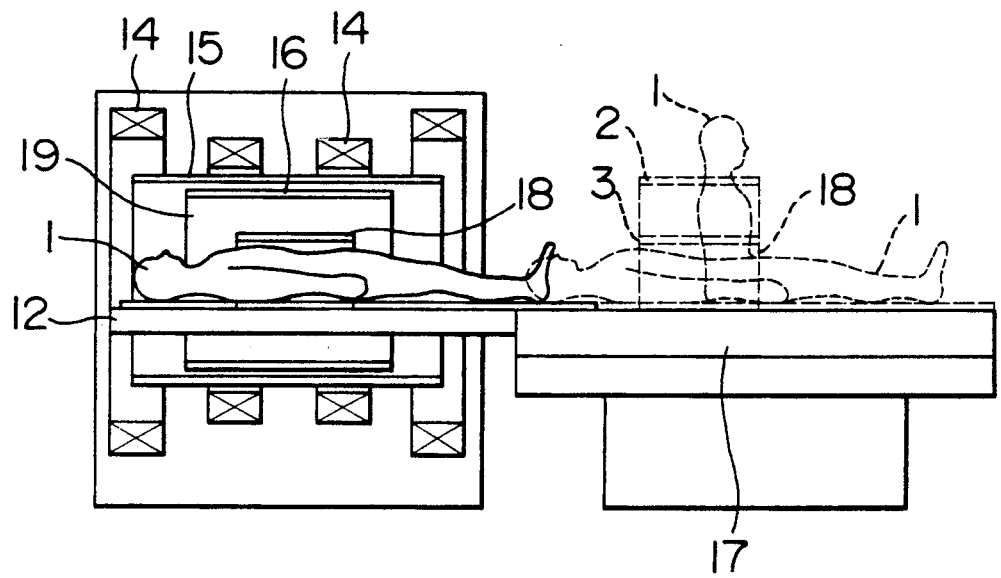
FIG. 6 is a schematic view showing an arrangement of the receiving coil of FIG. 1 in the magnet section of an MR imaging apparatus.
Figure 7:
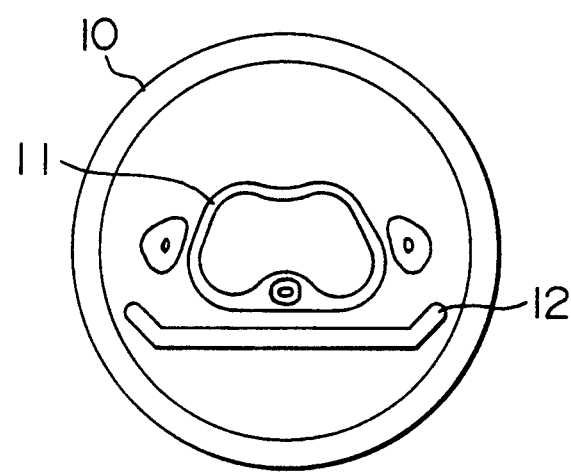
FIG. 7 is a cross-section of a conventional receiving coil.
Figure 8:
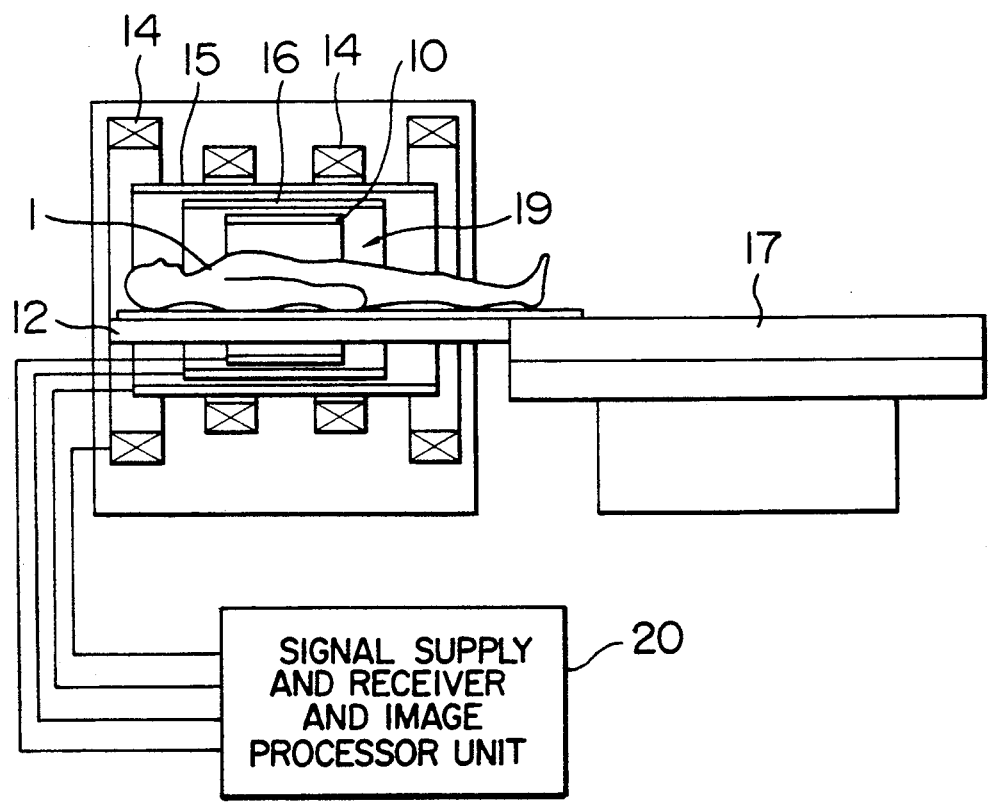
FIG. 8 is a schematic view showing an arrangement of a receiving coil in the magnet section of a conventional MR imaging apparatus.

The receiving coil 18 is disposed on a bed slide plate 12 of a bed 17 in an MR imaging apparatus, as shown in FIG. 6. The receiving coil 18 is formed of an upper and a lower coil cover 2 and 3 as shown in FIGS. 1 and 2, and an open-close mechanism 9 connecting these upper and lower coil covers as shown in FIG. 3. The open-close mechanism 9 has a hinge structure fixed to the upper coil cover 2 and to the lower coil cover 3 with screws 20. The open-close mechanism 9 is pivotally rotatable about an open-close part 4 formed of a pin or the like, and is openable and closable as shown in FIGS. 4 and 5.

The lower coil cover 3 is formed of a plate member slowly curved in conformity with the back of a body to be inspected. The upper coil cover 2 and the lower coil cover 3 are connected through the above-mentioned open-close mechanism 9 at connecting portions 21 and 22 which extend from the respective side portions at one end. On the other side of the same end of the upper coil cover 2, a stopper 23 projects in an arc shape as shown in FIG. 1. When the upper coil cover 2 is closed relative to the lower coil cover 3, the front end (bottom end) of the stopper 23 abuts against one side of the lower coil cover 3 disposed below. In the state when the receiving coil 18 is closed, as shown in FIGS. 1 and 4, the lower coil cover 3, the upper coil cover 2, and the stopper of the upper coil cover 2 form an elliptic cross-section surrounding the body 1 to be inspected. Since the receiving coil 18, when closed, surrounds the body 1 to be inspected in a proximity state, the ratio of volume occupied by the body to be inspected to the space inside the receiving coil 18 can be doubled compared to the conventional case. The filling factor $\eta$ is increased. The detection sensitivity of the receiving coil 18 is thus increased. As a result, an image with a high S/N ratio can be obtained. In FIG. 4, reference numeral 11 represents a cross-section of the abdominal part of a human body, and reference numeral 24 represents a cross-section of the arm part of the human body.

As shown in FIG. 2, an upper coil 6 and a lower coil 7 are accommodated in the upper coil cover 2 and the lower coil cover 3, respectively. These lower and upper coils 7 and 6 are connected through flexible metallic wire 8 as shown in FIGS. 2 and 3A, thereby constituting a single coil (the receiving coil 18) with the lower and upper coils 7 and 6. In place of the metallic wire 8, a metallic plate 8' can also be used as shown in FIG. 3B. As shown, the metallic wires 8 or metallic plates 8' extend substantially in parallel to one another. The receiving coil 18 is connected to a tuning circuit 5 as shown in FIG. 2. As shown in FIGS. 1 and 2, there is provided an opening 30 in the upper coil 6 to accommodate folded hands of a patient 1, etc. Further, as shown in FIG. 1, the connecting portions 21 and 22 and the stopper 23 are provided at one end of the upper and lower coils 6 and 7 with respect to the direction of the longitudinal body axis, thereby avoiding interference of the shoulders, arms, etc. of the patient 1 with the coil, as far as possible.

Such a constructed receiving coil 18 is mounted on the bed slide plate 12 of the bed so as to be transportable, with its direction changed by 180 degrees with respect to the body axis of the patient. When the bed slide plate 12 is outside of the accommodation space 19, the upper coil cover 2 of the receiving coil 18 is opened to allow a patient to lie down on the lower coil cover 3 or to get up from the lower coil cover and to get off the bed. At the time of inspection, the part of the patient to be inspected is covered with the lower and the upper coil covers 3 and 2, and is transported into the accommodation space 19 by a horizontal movement of the bed slide plate 12. An inspection utilizing nuclear magnetic resonance phenomenon is performed in this state.

Here, since the receiving coil 18 is disposed in the vicinity of the body 1 to be inspected, the ratio of the volume inside the receiving coil 18 and the volume which the body to be inspected occupies in this volume becomes about 1:1, to make the filling factor increased (about 1.0) to about two times of the conventional value (about 0.5) and hence also make the S/N ratio increased to about two times of the conventional value.

This receiving coil 18 can widely detect the breast part or the abdominal part of a body 1 to be inspected, and can detect with a high sensitivity the NMR signals generated from the whole body region such as the breast part or the abdominal part of a patient.

Further, this receiving coil 18 is arranged movable with respect to the bed slide plate 12, it is easy to use.

Although the present invention has been described hereinabove specifically based on the preferred embodiment, it is not limited to the above-described embodiment. It goes without saying that various alterations and modifications can be made without departing from the sprit and scope of this invention.

Since the inventive receiving coil can improve the filling factor, compared to the conventional receiving coil for the whole body use, the S/N ratio obtainable can be improved to about two times or more of the conventional one. Also, the receiving region (observation region) of the NMR signal according to this invention is not localized as in the case of the surface coil. A wide observation region comparable to the conventional one can be provided.

We claim:

1. A receiving coil arrangement including a pair of coils for a magnetic resonance imaging apparatus for imaging a trunk portion including at least one of a chest and abdominal area of a human body to be inspected, the receiving coil arrangement comprising:

connecting means for enabling joining of the pair of coils to one another in an openable and closeable manner; and means for covering the pair of coils including covering material covering the pair of coils so as to maintain a predetermined shape for the coils, the covering means covers one of the pair of coils so as to form a sheath portion around the one of the pair of coils, the sheath portion being extended to form a support for the trunk portion of the human body to be inspected, the covering means covering the other of the pair of coils so as to delimit an opening surrounded by the other of the pair of coils and the covering means thereof.

2. A receiving coil arrangement for a magnetic resonance imaging apparatus for imaging a trunk portion including at least one of a chest and abdominal area of a human body to be inspected, the receiving coil arrangement comprising:

a pair of coils for sandwiching the trunk portion of the human body to be inspected when the truck portion of the human body to be inspected is accommodated therebetween, the coils being configured so as to be spaced from one another and to delimit openings at side portions extending from one end of the pair of coils corresponding to an end proximate to a head of the human body when the truck portion is accommodated in the apparatus and extending toward the abdominal area of the trunk portion so as to enable at least arms of the human body to be accommodated without interference with the pair of coils;

connecting means for connecting the pair of coils, the connecting means being disposed at one side of the pair of coils proximate to the abdominal area of the trunk portion of the human body to be inspected, the connecting means enabling joining of the pair of coils to one another in an openable and closeable manner;

means for covering the pair of coils including covering material covering the pair of coils so as to maintain a predetermined shape for the coils; and retaining means for maintaining a predetermined spacing of the coils from one another, the retaining means being disposed at another side edge of the pair of coils opposite to the connecting means disposed at the one side edge, the retaining means being arranged so as to enable positioning of at least one arm of the human body to be inspected without interference therewith, the retaining means being formed integrally with the covering material.

3. A receiving coil arrangement for a magnetic resonance imaging apparatus for imaging a trunk portion including at least one of a chest and abdominal area of a human body to be inspected, the receiving coil arrangement comprising:

a pair of coils for sandwiching the trunk portion of the human body to be inspected when the truck portion of the human body to be inspected is accommodated therebetween, the coils being configured so as to be spaced from one another and to delimit openings at side portions extending from one end of the pair of coils corresponding to an end proximate to a head of the human body when the truck portion is accommodated in the magnetic resonance imaging apparatus and extending toward the abdominal area of the trunk portion so as to enable at least arms of the human body to be accommodated without interference with the pair of coils;

connecting means for connecting the pair of coils, the connecting means being disposed at one side of the pair of coils proximate to the abdominal area of the trunk portion of the human body to be inspected, the connecting means enabling joining of the pair of coils to one another in an openable and closeable manner; and retaining means for maintaining a predetermined spacing of the coils from one another, the retaining means being disposed at another side of the pair of coils opposite to the connecting means at the one side, the retaining means being arranged so as to enable positioning of at least one are of the human body to be inspected without interference therewith.

4. A receiving coil arrangement according to claim 3, wherein the retaining means extends from a side edge of one of the pair of coils in a direction toward an opposing side edge of the other of the pair of coils so that the retaining means enables contact with the opposing side edges of the other of the pair of coils so as to maintain the spacing between the pair of coils when the pair of coils are in a closed position.

5. Magnetic resonance imaging apparatus for imaging a trunk portion including at least one of a chest and abdominal area of a human body to be inspected, the magnetic resonance imaging apparatus comprising:

static field means for generating a static magnetic field in a region wherein the trunk portion of the human body to be inspected is accommodated;

gradient field means for generating a gradient magnetic field in superposition to the static magnetic field in the region;

RF field means for generating a high frequency magnetic field in superposition to the static magnetic field in the region so as to enable nuclear magnetic resonance (NMR) in the trunk portion of the human body to be inspected;

receiving means for detecting NMR signals generated in the trunk portion of the human body to be inspected, the receiving means including a pair of coils for sandwiching the trunk portion of the human body to be inspected when the truck portion of the human body to be inspected is accommodated therebetween, the coils being configured so as to be spaced from one another and to delimit openings at side portions extending from one end of the pair of coils corresponding to an end proximate to a head of the human body when the trunk portion is accommodated in the apparatus and extending toward the abdominal area of the trunk portion so as to enable at least arms of the human body to be accommodated without interference with the pair of coils;

connecting means for connecting the pair of coils, the connecting means being disposed at one side of the pair of coils proximate to the abdominal area of the trunk portion of the human body to be inspected, said connecting means enabling joining of the pair of coils to one another in an openable and closeable manner; and retaining means for maintaining a predetermined spacing of the coils from one another, the retaining means being disposed at another side of the pair of coils opposite to the connecting means disposed at the one side, the retaining means being arranged so as to enable positioning of at least one arm of the human body to be inspected without interference therewith.

6. A magnetic resonance imaging apparatus for imaging a trunk portion including at least one of a chest and abdominal area of a human body to be inspected, the magnetic resonance imaging apparatus comprising:

static field means for generating a static magnetic field in a region wherein the trunk portion of the human body to be inspected is accommodated;

gradient field means for generating a gradient magnetic field in superposition to the static magnetic field in the region;

RF field means for generating a high frequency magnetic field in superposition to the static magnetic field in the region so as to enable nuclear magnetic resonance (NMR) in the trunk portion of the human body to be inspected;

receiving means for detecting NMR signals generated in the trunk portion of the human body to be inspected, the receiving means including a pair of coils for sandwiching the trunk portion of the human body to be inspected when the truck portion of the human body to be inspected is accommodated therebetween, the coils being configured so as to be spaced from one another and to delimit openings at side portions extending from one end of the pair of coils corresponding to an end proximate to a head of the human body when the trunk portion is accommodated in the apparatus and extending toward the abdominal area of the trunk portion so as to enable at least arms of the human body to be accommodated without interference with the pair of coils;

connecting means for connecting the pair of coils, the connecting means being disposed at one side of the pair of coils proximate to the abdominal area of the trunk portion of the human body to be inspected, said connecting means enabling joining of the pair of coils to one another in an openable and closeable manner;

means for covering the pair of coils including covering material covering the pair of coils so as to maintain a predetermined shape for the coils; and retaining means for maintaining a predetermined spacing of the coils from one another, the retaining means being disposed at another side edge of the pair of coils opposite to the connecting means disposed at the one side edge, the retaining means being arranged so as to enable positioning of at least one arm of the human body to be inspected without interference therewith, the retaining means being formed integrally with the covering material.

7. A magnetic resonance imaging apparatus for imaging a trunk portion including at least one of a chest and abdominal area of a human body to be inspected, the magnetic resonance imaging apparatus comprising:

static field means for generating a static magnetic field in a region wherein the trunk portion of the human body to be inspected is accommodated;

gradient field means for generating a gradient magnetic field in superposition to the static magnetic field in the region;

RF field means for generating a high frequency magnetic field in superposition to the static magnetic field in the region so as to enable nuclear magnetic resonance (NMR) in the trunk portion of the human body to be inspected;

receiving means for detecting NMR signals generated in the trunk portion of the human body to be inspected, the receiving means including a pair of coils for sandwiching the trunk portion of the human body to be inspected when the truck portion of the human body to be inspected is accommodated therebetween, the coils being configured so as to be spaced from one another and to delimit openings at side portions extending from one end of the pair of coils corresponding to an end proximate to a head of the human body when the trunk portion is accommodated in the apparatus and extending toward the abdominal area of the trunk portion so as to enable at least arms of the human body to be accommodated without interference with the pair of coils;

connecting means for connecting the pair of coils, the connecting means being disposed at one side of the pair of coils proximate to the abdominal area of the trunk portion of the human body to be inspected, said connecting means enabling joining of the pair of coils to be one another in an openable and closeable manner; and means for covering the pair of coils including covering material covering the pair of coils so as to maintain a predetermined shape for the coils, said covering means covers one of the pair of coils so as to form a sheath portion around the one of the pair of coils, the sheath portion being extended to form a support for the trunk portion of the human body to be inspected, the covering means covering the other part of the pair of coils so as to delimit an opening surrounded by the other of the pair of coils and the covering means thereof.

* * * * *